United States Patent
Miehling

(10) Patent No.: US 6,687,131 B1
(45) Date of Patent: Feb. 3, 2004

(54) TRANSPONDER AND INJECTION-MOLDED PART AND METHOD FOR MANUFACTURING SAME

(75) Inventor: Martin Miehling, Granges (CH)

(73) Assignee: Sokymat S.A., Veveyse (CH)

( * ) Notice: Subject to any disclaimer, the term of this patent is extended or adjusted under 35 U.S.C. 154(b) by 0 days.

(21) Appl. No.: 09/512,223

(22) Filed: Feb. 24, 2000

(30) Foreign Application Priority Data

May 14, 1999 (EP) .............................................. 99810432
Dec. 12, 1999 (EP) .............................................. 99811181

(51) Int. Cl.[7] .............................. H05K 7/02; H05K 7/06; H05K 7/08; H05K 7/10
(52) U.S. Cl. ........................ 361/760; 361/737; 174/52.2
(58) Field of Search ................................ 361/736, 737, 361/748–751, 760–765; 174/52.1; 340/572.2, 572.7, 572.8, 447; 343/895, 702; 152/152.1

(56) References Cited

U.S. PATENT DOCUMENTS

| | | | | |
|---|---|---|---|---|
| 4,911,217 A | * | 3/1990 | Dunn et al. ............... | 152/152.1 |
| 5,181,975 A | * | 1/1993 | Pollack et al. ............ | 152/152.1 |
| 5,420,757 A | | 5/1995 | Eberhardt et al. | |
| 5,574,470 A | * | 11/1996 | de Vall ........................ | 343/893 |
| 5,604,485 A | * | 2/1997 | Lauro et al. ................. | 340/572 |
| 5,606,488 A | * | 2/1997 | Gustafson ................... | 361/782 |
| 5,690,773 A | | 11/1997 | Fidalgo et al. | |
| 5,731,754 A | * | 3/1998 | Lee, Jr. et al. ............... | 340/447 |
| 5,800,763 A | | 9/1998 | Hoppe et al. | |
| 5,856,378 A | * | 1/1999 | Ring et al. ................... | 523/205 |
| 5,879,502 A | * | 3/1999 | Gustafson .................... | 156/292 |
| 6,031,459 A | * | 2/2000 | Lake ......................... | 340/572.8 |
| 6,087,930 A | * | 7/2000 | Kulka et al. ................. | 340/447 |
| 6,100,804 A | * | 8/2000 | Brady et al. ............. | 540/572.7 |
| 6,285,561 B1 | * | 9/2001 | Aflenzer et al. ............. | 361/767 |

FOREIGN PATENT DOCUMENTS

| | | |
|---|---|---|
| EP | 0692770 | 1/1996 |
| WO | WO 98 53424 | 11/1998 |

\* cited by examiner

Primary Examiner—Kamand Cuneo
Assistant Examiner—Tuan Dinh
(74) Attorney, Agent, or Firm—Oliff & Berridge, PLC

(57) ABSTRACT

A transponder contains an integrated circuit, a power transmitting component (antenna) and a capsule made of a thermoplastic resin (hot glue) that surrounds the circuit continuously at least on one surface of the circuit. The glue preferably is a polyamide and surrounds the circuit protectively, ensuring a mechanical connection between the circuit and the antenna. The encapsulation with the hot glue is conducted at pressures and temperatures that are below the pressures and temperatures encountered during conventional injection molding. The transponder can be integrated into an injection molded part, for example a coin, by being placed in an injection mold in which it is supported by feet and then surrounded by molding material in a conventional injection molding process so that it develops a more resistant sheath.

16 Claims, 7 Drawing Sheets

TRANSPONDER AND INJECTION-MOLDED PART AND METHOD FOR MANUFACTURING SAME

BACKGROUND OF THE INVENTION

1. Field of the Invention

The invention relates to a transponder as installed primarily in maps or marks for identification of objects of various types, but also of persons or animals, and to a method of making such transponders.

2. Discussion of Related Art

Transponders are well known in the art and generally comprise an electrical circuit having a coil connected to an integrated circuit. The transponder is responsive to a received radio frequency signal and produces a radio frequency signal.

U.S. Pat. No. 5,420,757 describes a transponder according to the species in which the electrical circuit is encapsulated in epoxy resin or thermoplastic material. Such a capsule is made by conventional injection molding. This method has a number of drawbacks. In particular, the circuit is exposed to high temperatures and pressures during the molding, which conditions often lead to damage of the circuit. Conventional injection molding typically is conducted at a temperature of 180–400° C. and a pressure of 1,000–2,000 bars. Under such conditions, the baking lacquer of the coils softens at high temperatures, so that the coils may disintegrate. Soldered connections may also soften. Since high stresses may be acting on the components because of the high pressure, particularly when they have no connections to which they can be attached during injection molding, they have to be connected to expensive holders or supports made of a suitable material so that they are not displaced in the cavity during the injection molding process. This could lead to incomplete encapsulation and damage in subsequent processing steps. Moreover, the holders penetrate the capsule and then have to be separated by punching or another similar work step. Making an intact capsule becomes more difficult and expensive.

SUMMARY OF THE INVENTION

It is one object of the invention to provide an electrical circuit of a transponder having an enveloping capsule.

It is a further object of the present invention to develop a simple and inexpensive method for manufacturing such a transponder.

These and other objects are achieved by the present invention. In the invention, the circuitry of a transponder is encapsulated within a hot melt material having a relatively low melting point. The hot melt encapsulation provides protection of the electronics of the transponder against damage from harsh environments, including those encountered in further processing (injection molding) of the transponder.

More in particular, the invention relates to a transponder comprising an electrical circuit containing at least one component suitable for interaction with an electromagnetic field encapsulated within a capsule, wherein the capsule comprises a thermoplastic resin having a melting point of from 120° C. and 250° C., and wherein the electrical circuit is encapsulated by the thermoplastic resin.

The invention also relates to a method for manufacturing a transponder comprising an electrical circuit containing at least one component suitable for interaction with an electromagnetic field encapsulated within a capsule, wherein the capsule comprises a thermoplastic resin having a melting point of from 120° C. and 250° C., and wherein the electrical circuit is encapsulated by the thermoplastic resin, comprising placing at least one of the electrical circuits in a cavity of a mold, and feeding the thermoplastic resin in molten form into the cavity to encapsulate the at least one electrical circuit and form the capsule, wherein the feeding is conducted at a temperature of from 120° C. to 260° C. and at a pressure of from 5 to 40 bars.

DETAILED DESCRIPTION OF PREFERRED EMBODIMENTS

Figure 1A:
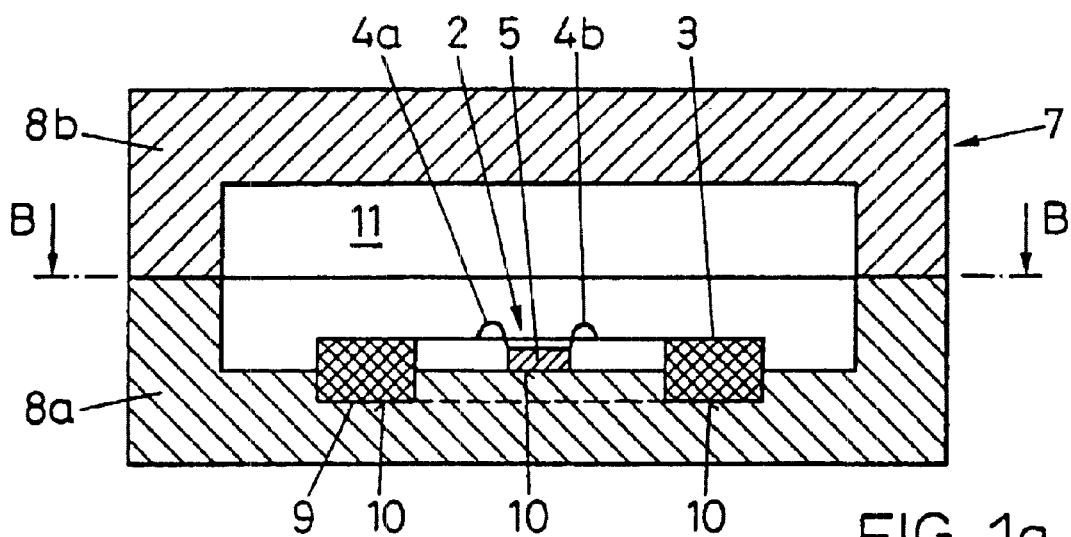
FIG. 1A is a cross section through a mold during a first phase of a first embodiment of the method according to the invention for making a transponder according to the invention.

The transponder according to the invention is enveloped by its capsule so that it is optimally protected from damage and can safely be exposed to a harsh (i.e., high temperature and pressure) environment. That is, it is important to ensure mechanical stability of at least an integrated circuit and an antenna or coil of the transponder. Most preferably, the circuitry of the transponder is completely encapsulated within the hot melt thermoplastic material of the capsule. However, it is also possible to encapsulate only one side of the transponder, for example the side on which the electrical connections of the transponder protrude so that the electrical connections between the integrated circuit and the antenna of the circuit are encapsulated, or the opposite side. The transponder can easily be laminated with film, particularly plastic film if needed, as a result of the mechanical stability. The encapsulated circuit can also easily be subjected to a further injection molding operation at higher temperatures and pressures without damaging the electrical circuit, again as a result of the mechanical stability.

The process of manufacture is simple and exposes the circuits to only relatively low pressures and temperatures during the complete encapsulation of the circuit with the hot melt thermoplastic resin, so that there is no damage to the circuit during manufacture. The circuits also do not have to be attached in a complicated fashion, but instead may be simply inserted into a final product.

Moreover, in the process, inexpensive molds such as aluminum, ceramic, plastic, textile or the like may be used, which mold materials are far cheaper than the steel molds used for conventional injection molding. The molds do not normally have to be heated. The molds may preferably be incorporated into the transponder itself, rather than used only for shaping of the mold.

Because of the low pressure, lighter and comparatively cheaper injection molding machines can be used when encapsulating the circuit in the hot melt thermoplastic material (hot glue).

The encapsulated transponders achieved by the invention can be exposed immediately to the high pressures and temperatures that normally occur in injection molding, because the circuits are enveloped in the hot melt thermoplastic resin as discussed above.

The invention thus also covers injection molded parts that include a transponder according to the invention, which can be designed specifically for such purpose. These can include coins, housings, consumer goods, pallets, etc. There are no limits on shaping. No difficulties are added to the manufacture of such injection molded parts by building in a transponder according to the invention as it can be inserted into the cavity and the capsule injected around it without this having to be taken especially into consideration when the parameters are established.

The invention will now be further described with specific reference to the drawing figures.

Figure 1B:
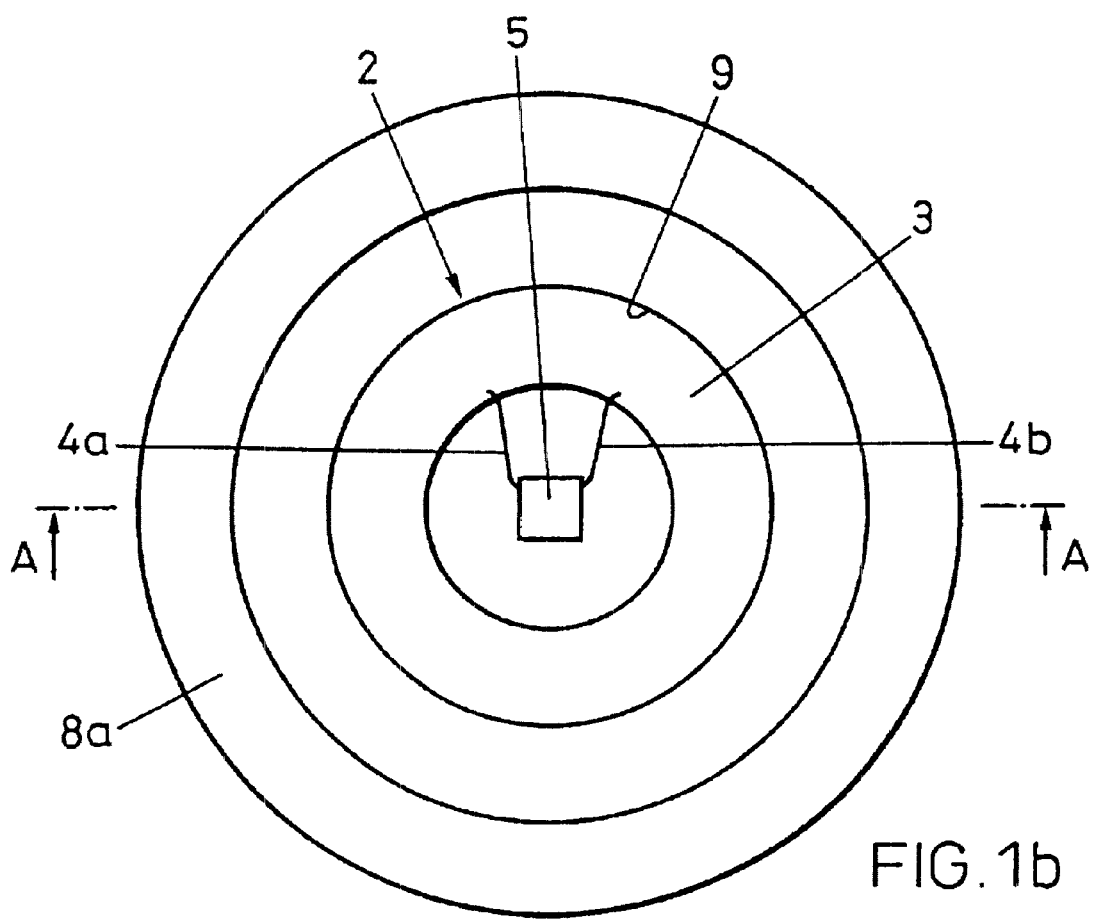
FIG. 1B is a top view of the bottom half of the mold according to FIG. 1A.
Figure 1C:
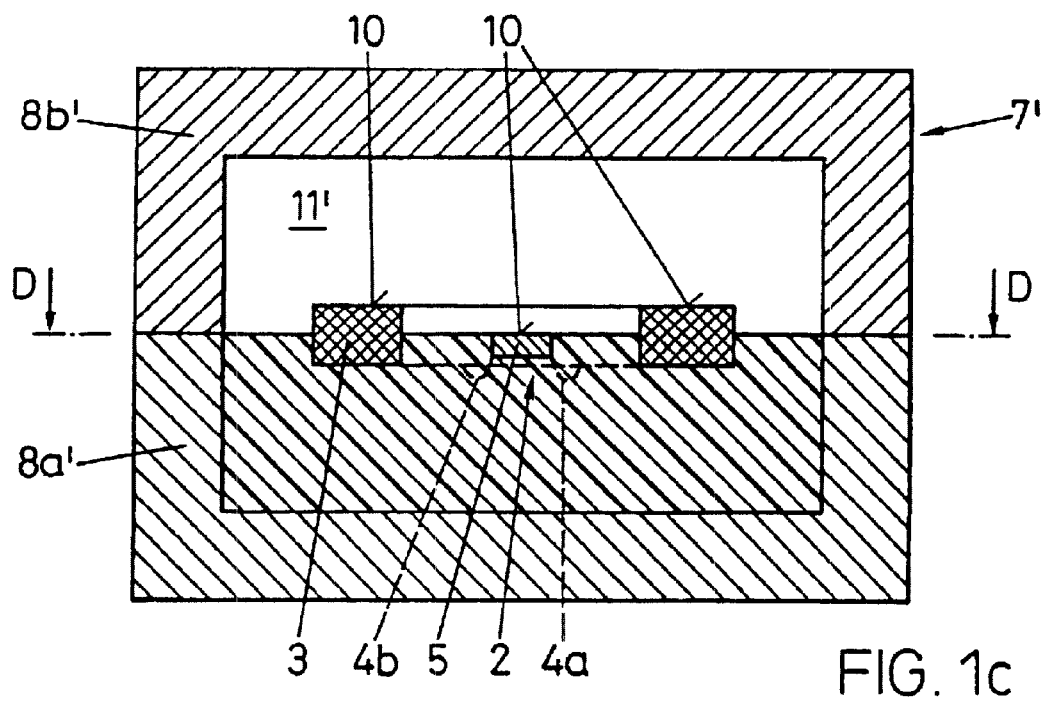
FIG. 1C is a cross section through the mold during a second phase of the first embodiment of the method according to the invention for manufacturing a transponder according to the invention.
Figure 1D:
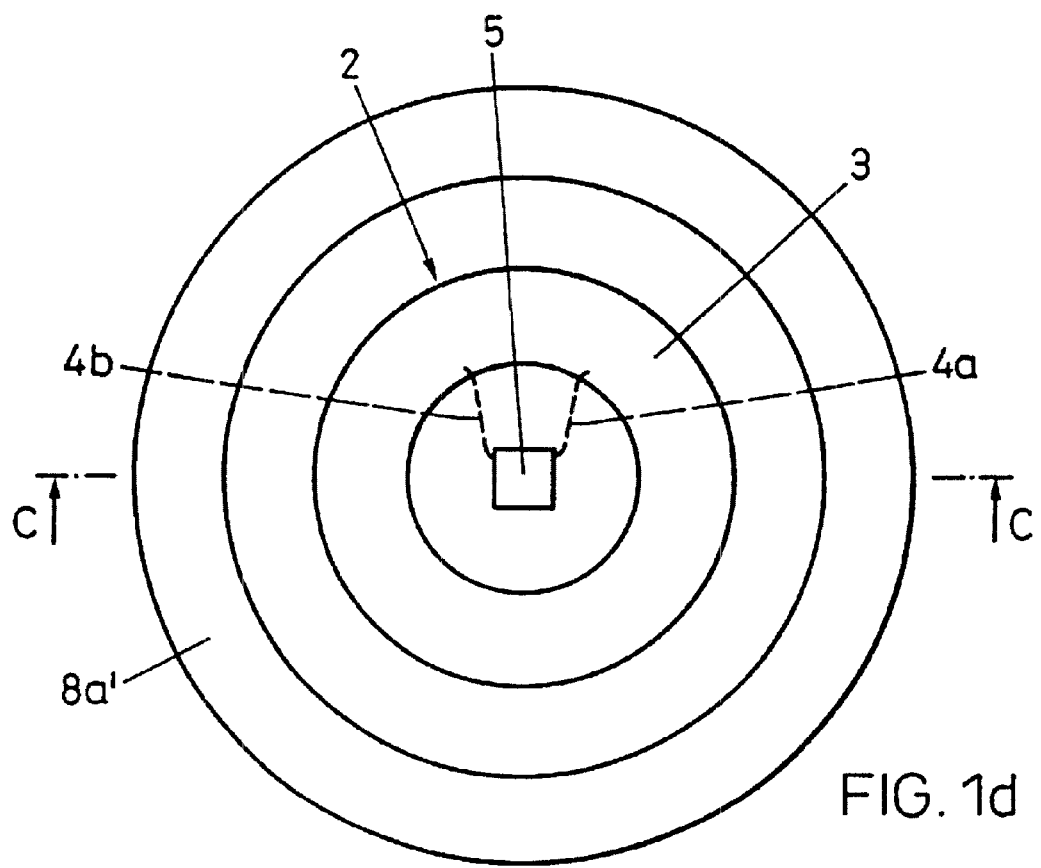
FIG. 1D is a top view of the bottom half of the mold according to FIG. 1C.
Figure 1E:
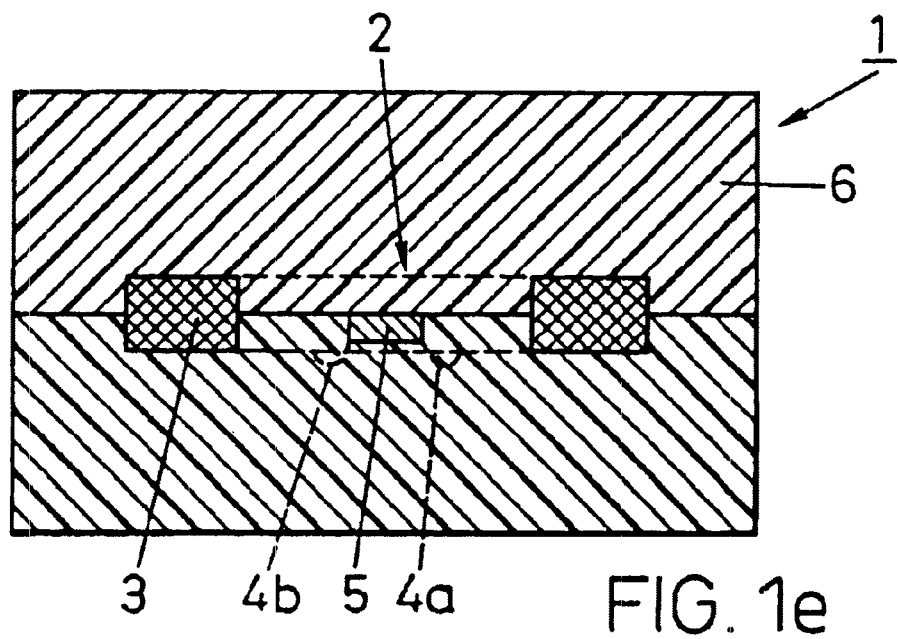
FIG. 1E is a cross section through a transponder according to the invention. manufactured according to the first embodiment of the method according to the invention.
Figure 1F:
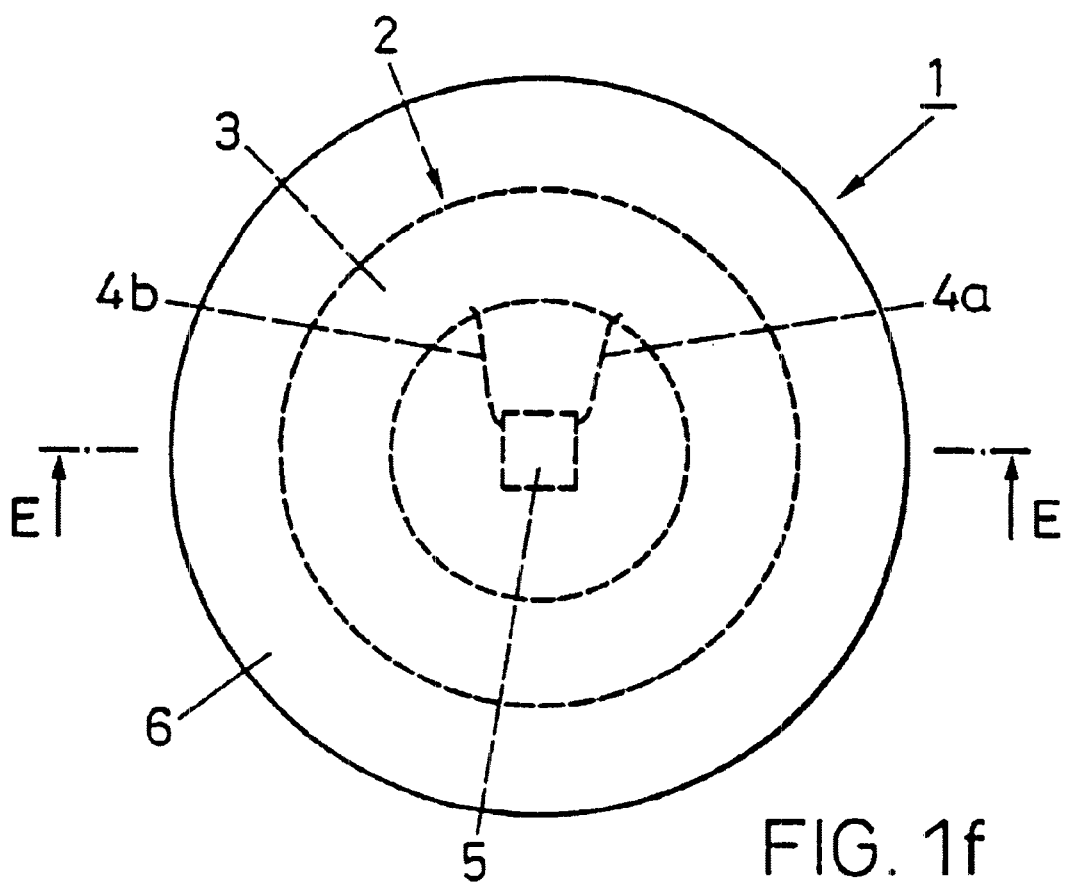
FIG. 1F is a top view of the transponder according to the invention, according to FIG. 1E.

A transponder 1 according to the invention (see, for example, FIGS. 1E and 1F) comprises an electrical circuit 2, which may be, for example, an antenna such as copper wire coil 3 held together by baked Lacquer as well known in the art, with electrical connections 4a, 4b that connect coil 3 with an integrated circuit 5 that likewise belongs to circuit 2. Circuit 2 is self-contained and has no external connections. It can interact by means of the antenna or coil with an external electromagnetic alternating field, and pick up energy, and transmit stored data. With a suitable design of integrated circuit 5, it can also receive and store data.

The hot glue is preferably made of polyamide, although any suitable hot melt thermoplastic material may be used. The hot glue preferably has a melting point of 250° C. maximum, 120° C. minimum, and most preferably between 180° C. and 220° C. The viscosity of the liquid glue is preferably low.

In this regard, it should be noted that the material of the capsule is a hot melt or thermoplastic material, preferably polyamide. Conventional injection molding materials, for example polyamide materials, used in injection molding have a processing temperature of 300° C. to 400° C. and require higher processing pressures (50 to 1,200 bar, more typically 400 to 1,200 bar), heated injection molding tools and hardened steel molds. The thermoplastic materials of the invention have lower melting temperatures, which lowers the viscosity of the melt and permits the use of significantly lower molding pressures and the use of, for example, aluminum molding materials.

In one preferred embodiment of the present invention, circuit 2 is completely enveloped by a capsule 6 made of hot glue (i.e., a hot melt thermoplastic resin).

In a first aspect of such an embodiment, a first mold 7 (FIGS. 1A and 1B) is prepared. The mold is preferably comprised of an inexpensive material such as aluminum, ceramic, plastic or textile.

The mold has a bottom mold half 8a and a top mold half 8b. Circuit 2 is located in bottom mold half 8a and the coil 3 is partially contained in a depression 9 of the mold to hold the coil. Integrated circuit 5 is approximately in the center of coil 3 on bottom mold half 8a and is held by connections 4a, 4b. These connections are electrical connections, i.e., connections that connect the coil to the integrated circuit in an electrically conducting manner. Thus, supporting surface, or back surface, 10 of circuit 2, consisting of the lower part of the outer surface of coil 3 and the bottom surface of integrated circuit 5, abuts a corresponding support surface of mold 7. The electrical connections are on the front, or electrical connection, surface of the circuit 2, i.e., the surface of the circuit from which the electrical connections protrude in connecting the integrated circuit to the coil.

Once first mold 7 has been closed by applying second mold half 8b, liquid hot glue is injected into the cavity 11 formed between mold halves 8a, 8b. The temperature of the hot glue should preferably be slightly higher than the melting point of the glue. Thus, the temperature at injection is, for example, between 120° C. and 260° C., more preferably between 190° C. and 230° C., and most preferably about 200° C. Because of the low viscosity of the liquid glue, injection can usually be done at a low pressure of, for example, between 5 and 40 bars, more preferably between 5 and 35 bars, and most preferably at approximately 20 bars. The pressures are usually less in cavity 11, namely slightly over 0 bar, until the cavity is completely filled when it too reaches the injection pressure.

Circuit 2 located in cavity 11 is surrounded partially, e.g., up to its middle plane, by the hot glue and supporting surface 10 remains exposed. Since the encapsulation takes place without high heat or mechanical loads, no damage to or displacement of circuit 2 by the entering glue is caused.

In this aspect of the invention, once the hot glue has set, the partially covered circuit 2 is removed from first mold 7, turned, and placed in a second mold half 8a' (FIGS. 1C, 1D) of a second, higher mold 7'. Supporting surface 10 then faces upward and is expose. Mold 7' is closed by applying a top mold half 8b' and its cavity 11' is filled with hot glue, which is preferably the same as the hot glue used to encapsulate the first half of the circuit. Supporting surface 10 is now also covered with hot glue and circuit 2 is completely covered. Capsule 6 is then complete. When the hot glue has set, mold 7' is opened and the disk-shaped transponder 1 (FIGS. 1E, 1F) is removed. Circuit 2, which is also approximately disk-shaped, is disposed symmetrically in capsule 6.

In another aspect of the invention similar to the first embodiment discussed above, the capsule encapsulates the circuit on only one side of the circuit. The electrical connections may or may not be encapsulated. This is accomplished by subjecting the circuit to encapsulation with the thermoplastic material on only one side in the above embodiment, i.e., by only conducting the encapsulation of FIGS. 1A and 1B on the front, electrical connection surface of the circuit or on the opposite, supporting surface of the circuit, but not the other. Preferably, the electrical circuits are encapsulated. In this way, the circuit is still suitably encapsulated for protection of the connections of the circuit as discussed above. However, this security in the connections is secondary to the mechanical stability of encapsulating the integrated circuit and the antenna/coil. The chip/module is mechanically connected to the coil by the hot melt thermoplastic resin, and thus the unit is handleable without risk of damage to the circuit. This aspect of the invention eliminates the additional encapsulation step on the opposite side of the circuit as above, thereby reducing the expense and time of the process.

Figure 2A:
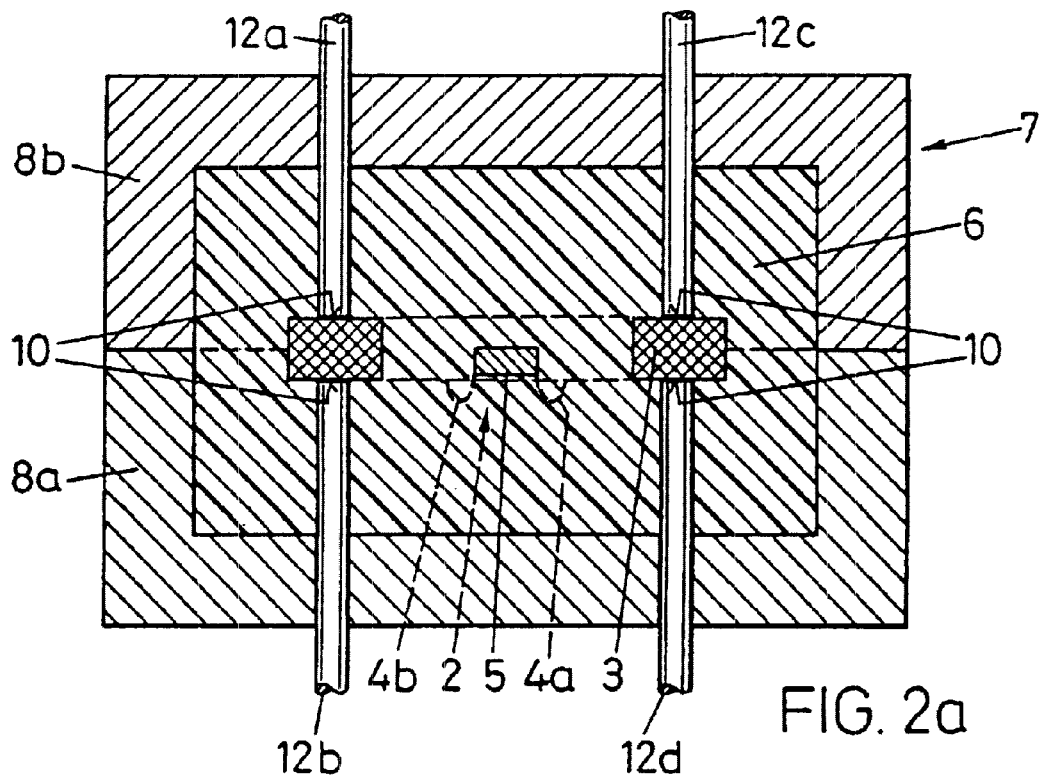
FIG. 2A is a cross section through a mold during a first phase of a second embodiment of the method according to the invention for manufacturing a transponder according to the invention.
Figure 2B:
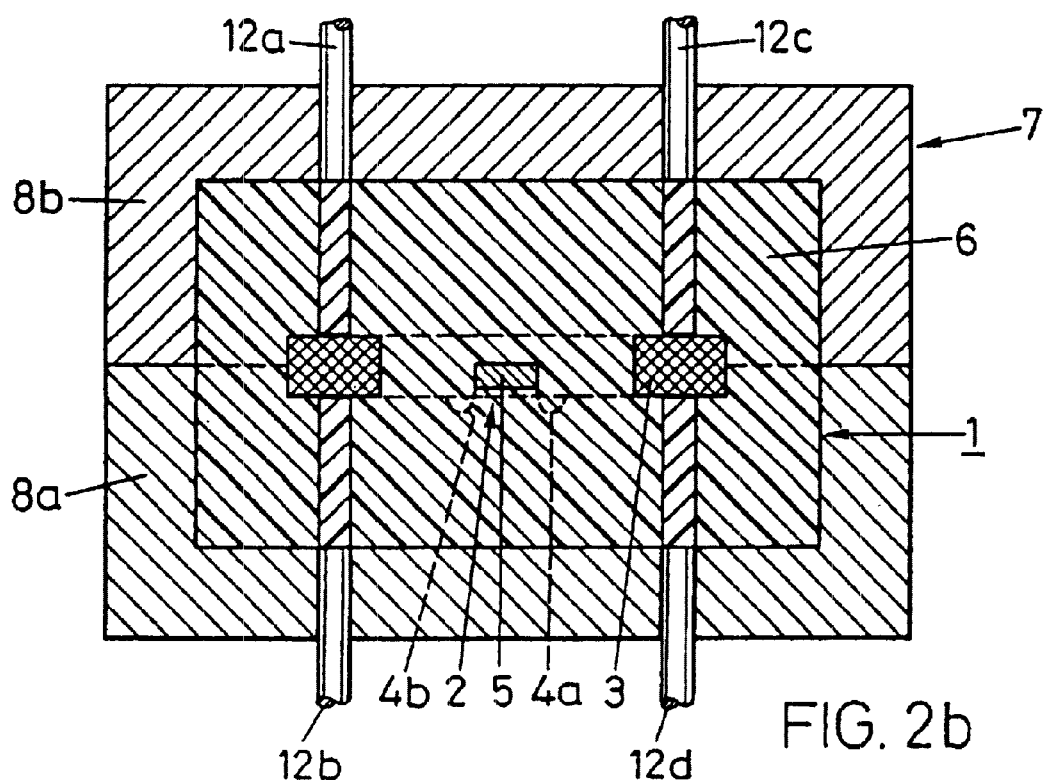
FIG. 2B is a cross section through the mold during a second phase of the second embodiment of the method according to the invention for manufacturing a transponder according to the invention.

According to another embodiment of the method according to the invention for manufacturing a transponder according to the invention, only one mold 7 is used and circuit 2 is held in the center of the cavity by four pins 12a, b, c, d whose end surfaces in turn form supporting surfaces, abutted by coil 3 with a supporting surface 10 consisting of four partial surfaces. Pins 12a, b, c, d form two pairs 12a, b and 12c, d, oriented toward each other, and hold coil 3 firmly between them. Although four pins are shown in FIGS. 2A and 2B for illustration purposes, any number of pins may be used, including only one where, for example, the one pin is a bearing surface that may be retracted like a pin during molding.

Once the hot glue has been injected and has set (FIG. 2A), pins 12a, b, c, d are pulled back to the wall of the cavity. More hot glue is injected and the space left by the retraction of pins 12a, b, c, d is filled (FIG. 2b). In this way, capsule 6 is once more complete and circuit 2 is completely covered with hot glue. When the second batch of hot glue has set, mold 7 is opened and transponder 1 is removed.

In a most preferred embodiment of the invention, the mold used during encapsulation with the hot glue is comprised of an inexpensive material that can be incorporated into the final transponder product. That is, the mold preferably forms a part or substantially all of the capsule or housing of the transponder. In this way, the circuit does not have to be removed from the mold following encapsulation, which might cause damage to the encapsulation material and/or circuit. Instead, the mold preferably forms a part of the capsule, and thus a part of the final product.

For this purpose, it is most preferred to use a plastic material as the mold, for example polyamide and the like, i.e., a material similar in chemical structure and properties to the material of the hot glue. However, any suitable mold material may be used including, for example, any suitable plastic, aluminum, textile, ceramic or the like.

Figure 5A:
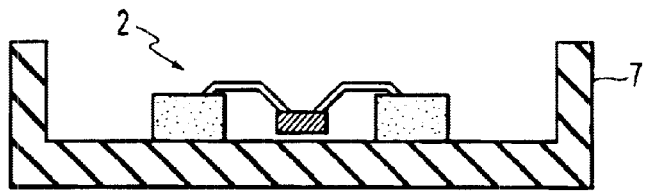
FIG. 5A is a cross section through a mold during a first phase of a fourth embodiment of the method according to the invention for making a transponder according to the invention in which the mold becomes a part of the transponder.
Figure 5B:
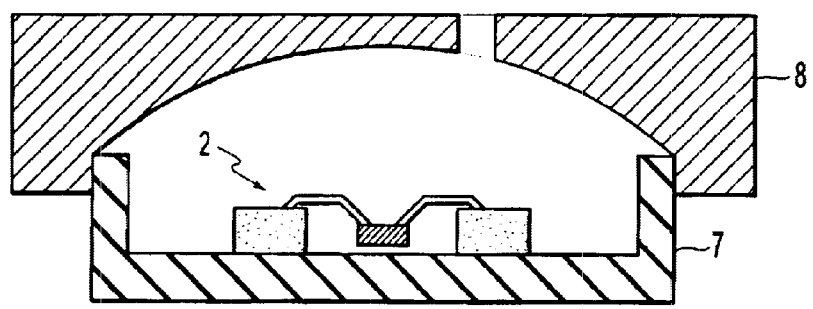
FIG. 5B is a cross section through a mold during a second phase of a fourth embodiment of the method according to the invention for making a transponder according to the invention in which the mold becomes a part of the transponder.
Figure 5C:
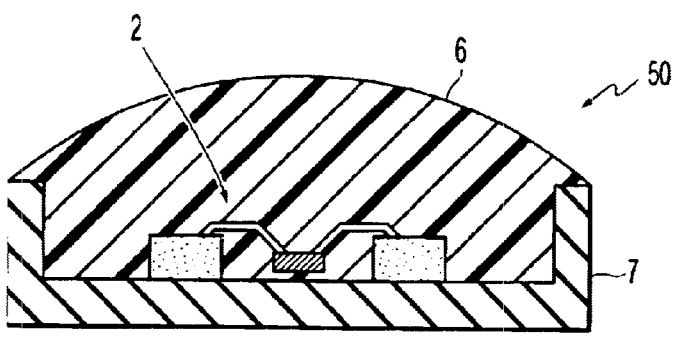
FIG. 5C is a cross section of the transponder of the fourth embodiment according to the invention in which the mold has become a part of the transponder.
Figure 5D:
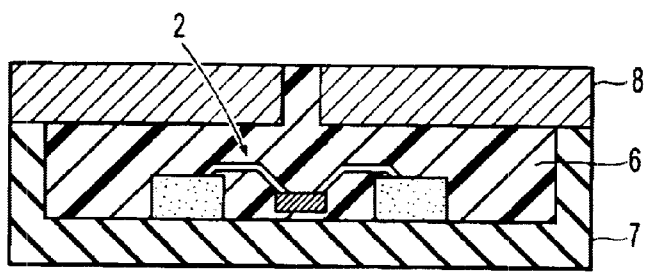
FIG. 5D is a cross section of the transponder of the fourth embodiment according to the invention in which the mold forms substantially the entire housing of the transponder.

This embodiment is illustrated in FIGS. 5A to 5D. The circuit 2 is located within mold 7 that will form a part of the housing and remain with the transponder. A top part 8 (FIG. 5B), for example an aluminum form, is then used to close the mold. The hot melt thermoplastic resin is then injected into the closed mold under the conditions discussed above. Following the injection, the encapsulated circuit 50 (FIG. 5C), encapsulated in the hot melt thermoplastic resin capsule 6, is obtained by removing top part 8. As can be seen, the mold 7 remains with the transponder to form a part of the housing. In FIG. 5D, top part 8 also becomes part of the housing and thus is not removed following encapsulation, thereby forming a transponder in which the mold forms substantially all of the housing of the transponder.

In the embodiment of FIGS. 5A–5C, the mold most preferably is used on the support, or back, surface of the circuit, and the injected hot melt thermoplastic resin encapsulates the electrical connection, or front, surface of the circuit as shown in FIG. 5C. The hot melt thermoplastic resin need not completely encapsulate the circuit in this embodiment, the mold itself protecting at least the support surface of the circuit.

Figure 3A:
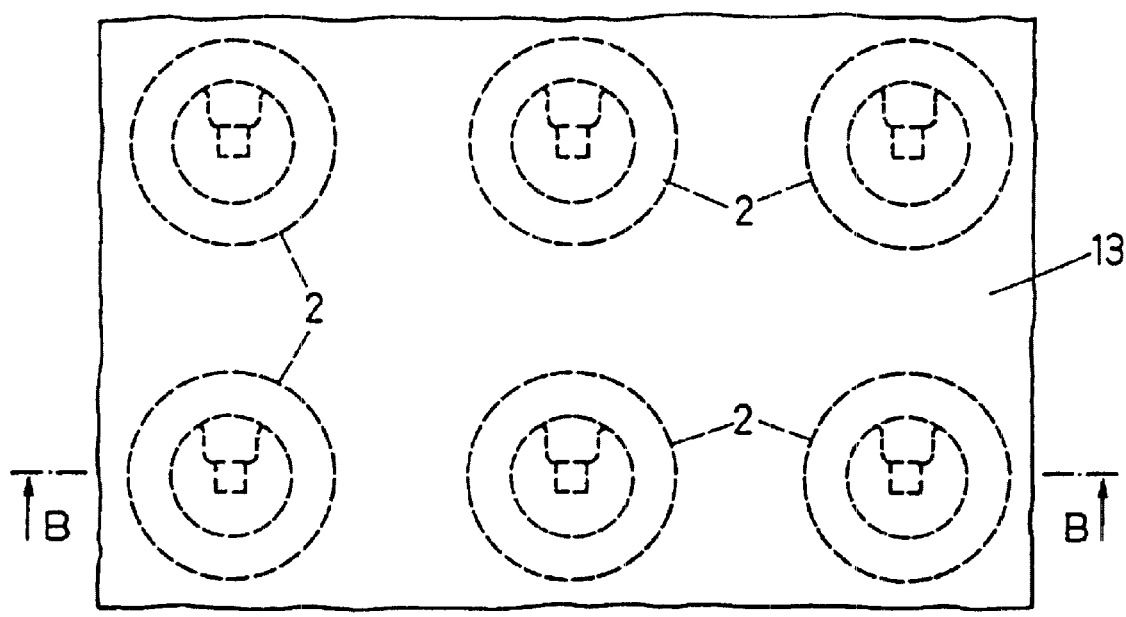
FIG. 3A is a top view of an intermediate product of a third embodiment of the method according to the invention for manufacturing a transponder according to the invention.
Figure 3B:
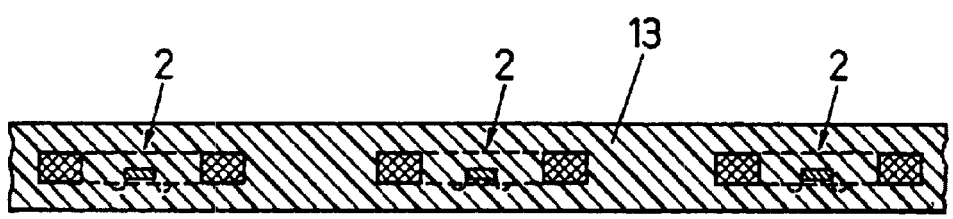
FIG. 3B is a cross section through the intermediate product according to FIG. 3A.

According to a still further embodiment of the method according to the invention for manufacturing a transponder according to the invention, several circuits are covered at the same time, so that they are temporarily held together by the hot glue coating. The method is the same in principle as in the first or in the second embodiment, but the mold is significantly larger and its cavity is, for example, a parallelepiped and flat, so that a plurality of circuits can be placed therein in a regular grid. The result of the injection molding step is a three-dimensional arrangement of circuits 2 embedded in hot glue, which form a plate 13 (FIGS. 3A and 3B). Circuits 2 are completely covered with hot glue and spaced apart from each other.

Figure 3C:
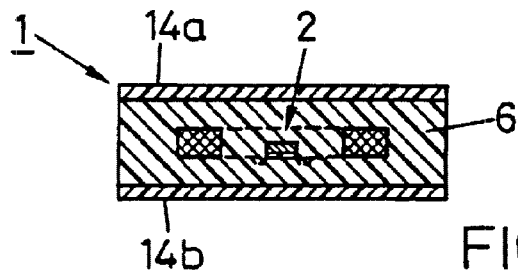
FIG. 3C is a cross section through a transponder according to the invention, manufactured according to the third embodiment of the method according to the invention.
Figure 3D:
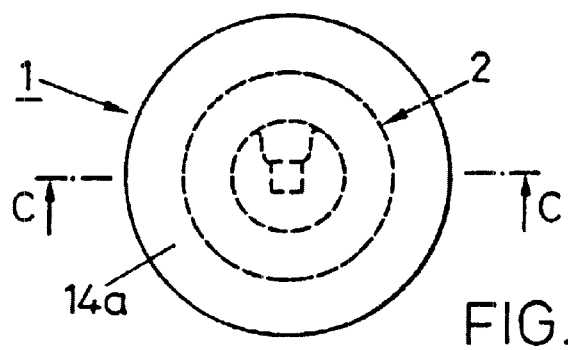
FIG. 3D is a top view of a transponder according to the invention according to FIG. 3C.

Plate 13 can be hot- or cold-laminated on one or both sides with a plastic film, most preferably polyvinyl chloride (PVC). It is then separated by a stamping tool into individual transponders 1 each of which is a circuit 2 completely surrounded by a capsule 6. Transponder 1 (FIGS. 3C and 3D) is constructed in essentially the same way as those Hi made according to the first or second embodiment of the method according to the invention but when plate 13 is laminated on both sides, it has cover layers 14a, b preferably made of PVC, but also possibly made of ABS, polycarbonate, polyester, or any other suitable plastic material. Plate 13 can be prepared such that a credit card or other card or a coin or the like containing a transponder 1 can immediately be punched out from it.

It is also possible to encapsulate several circuits together so that they form a line held together by the capsule or another arrangement of transponders that will later be held together by connecting sections which are separated mechanically, for example in a later work step.

Since the circuits are protected from high pressures and temperatures by the continuous capsules, the transponders according to the invention can be smoothly integrated into injection molded parts. By contrast nonencapsulated circuits cannot be smoothly integrated into injection molded parts because before injection of the injection-molding material with the conventional injection molding method, the circuits are disposed in the cavity of the injection mold.

Circuits of the invention can be specially designed for injection molding and provided with supporting elements.

Figure 4A:
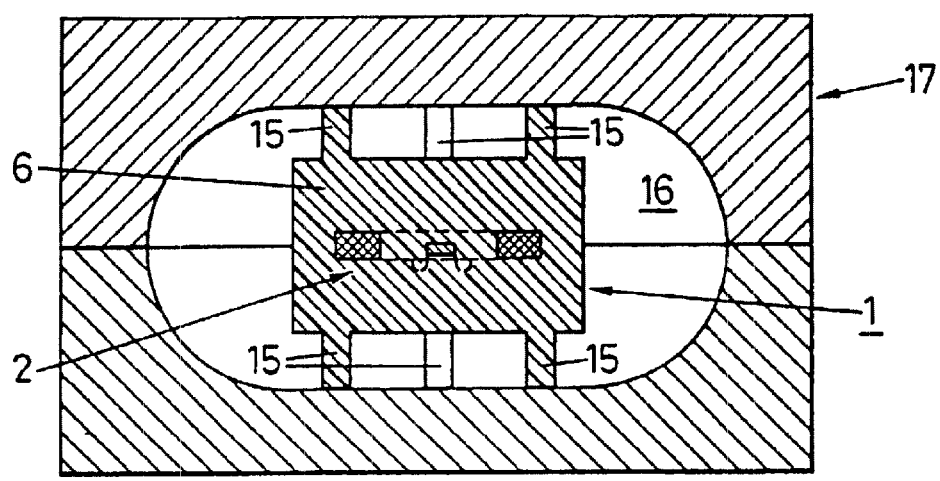
FIG. 4A is a cross section through an injection mold during a phase of the method according to the invention for manufacturing an injection molded part according to the invention.
Figure 4B:
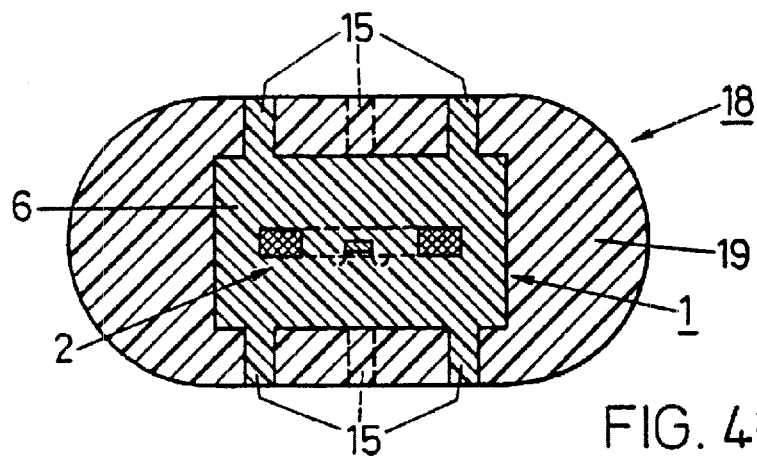
FIG. 4B is a cross section through an injection molded part according to the invention.
Figure 4C:
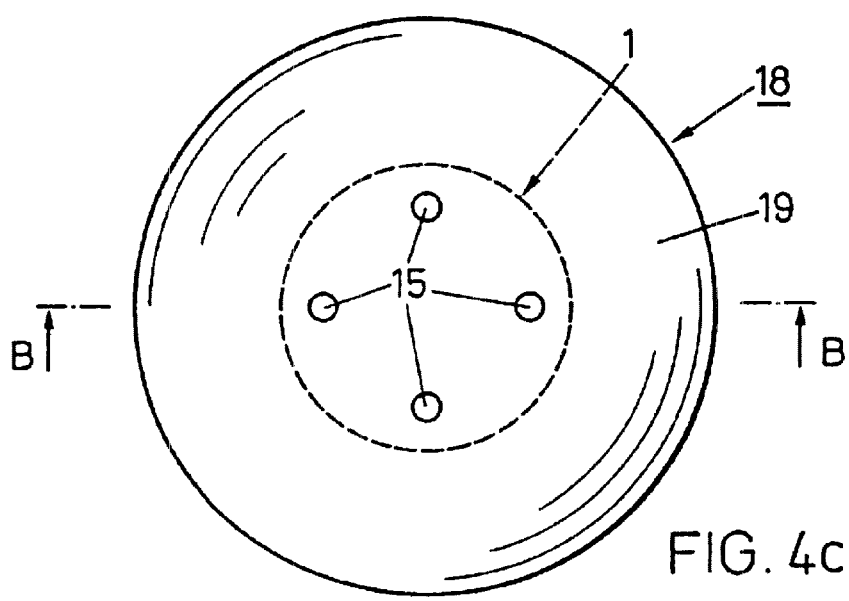
FIG. 4C is a top view of the injection mold part according to the invention according to FIG. 4B.

These can be formed as feet 15 of transponder 1 projecting from both sides of the capsule (FIGS. 4A–C). These feet can be produced by, for example, additional injection with a suitable design of the mold used to make them or by retraction of pins as used in the second embodiment of the method according to the invention, behind the wall of the cavity. In any case, they support transponder 1 (FIG. 4A) in a cavity 16 of an injection mold 17 made of hardened steel during the manufacture according to the invention of an injection molded part according to the invention in such fashion that it is reliably secured and cannot be displaced when the injection molding material is injected.

The temperatures during injection molding are higher by about 50° C. than during the production of capsule 6 of transponder 1. For example, the temperature during conventional injection molding is typically on the order of 180° C. to 400° C. In addition, the pressure of the injection molding is also higher than during the encapsulation, often by at least several hundred bars. For example, the pressure during conventional injection molding is on the order of 400 to 2,000 bars. Transfer molding, sometimes used in the electronics industry, uses pressures of 50 to 250 bars, which is still higher than the 5 to 40 bars of pressure used in encapsulation in the present invention. As a result of first encapsulating the circuit in the hot glue at lower temperatures and pressures, the circuit is able to easily withstand the harsher conditions of injection molding without damage and without special expensive additional processing to protect the circuits during injection molding.

It is also possible to provide a plastic or metal support surrounding the transponder for example annularly as a supporting element, said support being cast with the capsule, and whose outer area is then clamped between the halves of the injection mold to secure the transponder.

In the finished injection molded part according to the invention, for example a coin 18 or a token, transponder 1 is surrounded nearly completely by a sheath 19 of the injection molding material. Since it consists of injection molding material that is viscous and has a higher melting point than the hot glue that forms capsule 6 of transponder 1, sheath 19 is stronger and harder than the hot glue and coin 18 is correspondingly sturdy and resistant.

The injection molding material may comprise any suitable material. Such include any known plastics which can provide the transponder with higher chemical resistance, higher strength, higher temperature resistance, etc. compared to the thermoplastic resin of encapsulation. Specific injection molding materials include, for example, polyphenylene sulfide, acrylonitrile butadiene styrene (ABS) and polyethylene.

Transponder 1 can analogously also be integrated into more-complex injection molded parts, for example in vessels or containers, housings, pallets, vehicle parts, and consumer goods of all types.

The present invention thus offers many advantages over the prior art as discussed above, and including that the invention achieves a transponder that can be simply and inexpensively formed. The invention surprisingly utilizes a hot glue material, a material conventionally used in other arts to repair items, to fully encapsulate the circuitry of the transponder in order to protect the circuitry (a use not heretofore foreseen with such material). Also, it is not necessary in forming the capsule to first mount the circuitry on any type of substrate.

What is claimed is:

1. An electrical circuit comprised in integrated circuit, an antenna and one or more electrical connections between the integrated circuit and the antenna, wherein at least the integrated circuit and the antenna are encapsulated within a capsule such that the capsule mechanically connects the integrated circuit and the antenna to hold the integrated circuit and the antenna in a fixed position relative to each other, and wherein the capsule comprises a polyamide thermoplastic resin having a melting point of from 120° C. to 250° C. and a processing pressure of from 5 to 40 bar.

2. The electrical circuit according to claim 1, wherein the capsule completely encapsulates the electrical circuit.

3. The electrical circuit according to claim 1, wherein the capsule encapsulates the electrical circuit only on one surface of the electrical circuit.

4. The electrical circuit according to claim 1, wherein the electrical circuit is encapsulated within the capsule such that at least one or more electrical connections are encapsulated by the thermoplastic resin.

5. The electrical circuit according to claim 1, wherein the antenna is a coil.

6. The electrical circuit according to claim 1, wherein the polyamide resin of the capsule contacts the integrated circuit and the antenna.

7. Transponder according to claim 8, wherein the polyamide resin of the capsule contacts the integrated circuit and the antenna.

8. Transponder comprising an electrical circuit containing at least one component suitable for interaction with an electromagnetic field encapsulated within a capsule, wherein the capsule comprises a polyamide thermoplastic resin having a melting point of from 120° C. to 250° C. and a processing pressure of from 5 to 40 bar, and wherein the electrical circuit is encapsulated by the polyamide thermoplastic resin such that at least an integrated circuit and an antenna of the electrical circuit are encapsulated by the polyamide thermoplastic resin and are mechanically connected by the polyamide thermoplastic resin to hold the integrated circuit and the antenna in a fixed position relative to each other.

9. Transponder according to claim 8, wherein at least part of a surface of the capsule is covered with a cover layer of laminated film.

10. Transponder according to claim 8, wherein the antenna is a coil.

11. Transponder according to claim 8, wherein the electrical circuit further comprises one or more electrical connections connecting the integrated circuit in electrically conducting fashion with the antenna.

12. Transponder according to claim 8, wherein the capsule further comprises at least one supporting element projecting from a surface of the capsile.

13. Transponder according to claim 8, wherein the capsule includes a material used as a mold during encapsulation with the thermoplastic resin.

14. Transponder according to claim 8, wherein the transponder further comprises a sheath of injection molded resin surrounding the encapsulated electrical circuit.

15. Transponder according to claim 9, wherein the laminated film comprises a plastic.

16. Transponder according to claim 15, wherein the plastic is polyvinyl chloride.

* * * * *